(12) United States Patent
Yang et al.

(10) Patent No.: US 8,294,211 B2
(45) Date of Patent: Oct. 23, 2012

(54) SEMICONDUCTOR TRANSISTOR DEVICE STRUCTURE WITH BACK SIDE GATE CONTACT PLUGS, AND RELATED MANUFACTURING METHOD

(75) Inventors: Bin Yang, Mahwah, NJ (US); Rohit Pal, Clifton Park, NY (US); Michael Hargrove, Clinton Corners, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 201 days.

(21) Appl. No.: 12/687,610

(22) Filed: Jan. 14, 2010

(65) Prior Publication Data
US 2011/0169084 A1    Jul. 14, 2011

(51) Int. Cl.
*H01L 29/786* (2006.01)
(52) U.S. Cl. ......... 257/347; 257/E21.704; 257/E27.112; 257/E29.275; 438/151
(58) Field of Classification Search .................. 257/347, 257/E29.275, E21.704, E27.112; 438/151
See application file for complete search history.

(56) References Cited

U.S. PATENT DOCUMENTS

| 7,285,477 | B1 | 10/2007 | Bernstein et al. | |
| 7,402,866 | B2 * | 7/2008 | Liang et al. | 257/347 |
| 2008/0054313 | A1 * | 3/2008 | Dyer et al. | 257/276 |
| 2011/0012669 | A1 * | 1/2011 | Stuber et al. | 327/530 |

OTHER PUBLICATIONS

U.S. Office Action issued Dec. 13, 2011 in U.S. Appl. No. 12/687,607.

* cited by examiner

*Primary Examiner* — Trung Q Dang
(74) *Attorney, Agent, or Firm* — Ingrassia Fisher & Lorenz, P.C.

(57) ABSTRACT

A method of fabricating a semiconductor device with back side conductive plugs is provided here. The method begins by forming a gate structure overlying a semiconductor-on-insulator (SOI) substrate. The SOI substrate has a support layer, an insulating layer overlying the support layer, an active semiconductor region overlying the insulating layer, and an isolation region outboard of the active semiconductor region. A first section of the gate structure is formed overlying the isolation region and a second section of the gate structure is formed overlying the active semiconductor region. The method continues by forming source/drain regions in the active semiconductor region, and thereafter removing the support layer from the SOI substrate. Next, the method forms conductive plugs for the gate structure and the source/drain regions, where each of the conductive plugs passes through the insulating layer.

11 Claims, 17 Drawing Sheets

US 8,294,211 B2

SEMICONDUCTOR TRANSISTOR DEVICE STRUCTURE WITH BACK SIDE GATE CONTACT PLUGS, AND RELATED MANUFACTURING METHOD

CROSS-REFERENCE TO RELATED APPLICATION

The subject matter described here is related to the subject matter described in U.S. patent application Ser. No. 12/687,607, filed Jan. 14, 2010, the content of which is incorporated by reference herein.

TECHNICAL FIELD

Embodiments of the subject matter described herein relate generally to semiconductor devices. More particularly, embodiments of the subject matter relate to a semiconductor transistor device structure having conductive contact plugs formed from the back side of the substrate, and related manufacturing methods.

BACKGROUND

The majority of present day integrated circuits (ICs) are implemented by using a plurality of interconnected field effect transistors (FETs), which may be realized as metal oxide semiconductor field effect transistors (MOSFETs or MOS transistors). A MOS transistor may be realized as a p-type device (i.e., a PMOS transistor) or an n-type device (i.e., an NMOS transistor). Moreover, a semiconductor device can include both PMOS and NMOS transistors, and such a device is commonly referred to as a complementary MOS or CMOS device. A MOS transistor includes a gate electrode as a control electrode that is formed over a semiconductor layer, and spaced-apart source and drain regions formed within the semiconductor layer and between which a current can flow. The source and drain regions are typically accessed via respective conductive contacts formed on the source and drain regions, while the gate electrode is typically accessed via one or more conductive contacts coupled to a conductive gate contact formed at the upper part of the gate electrode. Bias voltages applied to the gate contact, the source contact, and the drain contact control the flow of current through a channel in the semiconductor substrate between the source and drain regions beneath the gate electrode. Conductive metal interconnects (plugs) formed in an overlying insulating layer are typically used to deliver bias voltages to the gate, source, and drain contacts.

BRIEF SUMMARY

An exemplary embodiment of a semiconductor transistor device is provided. The semiconductor transistor device includes at least one lower layer of dielectric material, a layer of semiconductor material overlying the at least one lower layer of dielectric material, and a gate structure formed overlying the layer of semiconductor material. The layer of semiconductor material has defined therein a channel region below the gate structure and a source/drain region adjacent to the channel region. The semiconductor transistor device also includes a conductive contact element electrically coupled to the source/drain region, and a conductive plug formed through the at least one lower layer of dielectric material.

An embodiment of a method of manufacturing a semiconductor device is also provided. The method provides a semiconductor device structure having a layer of insulating material, a layer of semiconductor material overlying the layer of insulating material, and a gate structure overlying the layer of semiconductor material. The layer of semiconductor material has defined therein a channel region below the gate structure and a source/drain region adjacent to the channel region. The method creates a recess in the layer of insulating material to expose the layer of semiconductor material proximate the source/drain region, resulting in exposed semiconductor material. The method continues by forming a silicide contact from the exposed semiconductor material.

An exemplary embodiment of a semiconductor device structure is also provided. The semiconductor device structure includes a layer of semiconductor material and two gate structures overlying the layer of semiconductor material. The two gate structures are arranged with a separation space between them. The semiconductor device structure also includes a source/drain region formed in the layer of semiconductor material, where at least a portion of the source/drain region is located under the separation space. The semiconductor device structure also includes a silicide contact formed in the layer of semiconductor material, the silicide contact being electrically coupled with the source/drain region.

Another exemplary embodiment of a semiconductor transistor device is also provided. The semiconductor transistor device includes at least one lower layer of dielectric material, a layer of semiconductor material overlying the at least one lower layer of dielectric material, a gate structure formed overlying the layer of semiconductor material, the gate structure comprising a conductive gate element, and a conductive plug formed through the at least one lower layer of dielectric material. The conductive plug is coupled to the conductive gate element.

A method of manufacturing a semiconductor device is also provided. The method provides a semiconductor device structure having a layer of insulating material, an isolation region overlying the layer of insulating material, a gate insulator layer overlying the isolation region, and a conductive gate element overlying the gate insulator layer. The method creates a recess through the layer of insulating material, the isolation region, and the gate insulator layer to expose a section of the conductive gate element. The method continues by forming a conductive plug in the recess, the conductive plug being electrically coupled to the conductive gate element.

Also provided is another embodiment of a method of fabricating a semiconductor device. This method forms a gate structure overlying a semiconductor-on-insulator (SOI) substrate, the SOI substrate comprising a support layer, an insulating layer overlying the support layer, an active semiconductor region overlying the insulating layer, and an isolation region outboard of the active semiconductor region. A first section of the gate structure is formed overlying the isolation region and a second section of the gate structure is formed overlying the active semiconductor region. The method continues by forming source/drain regions in the active semiconductor region, removing the support layer from the SOI substrate, and forming conductive plugs for the gate structure and the source/drain regions. Each of the conductive plugs passes through the insulating layer.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
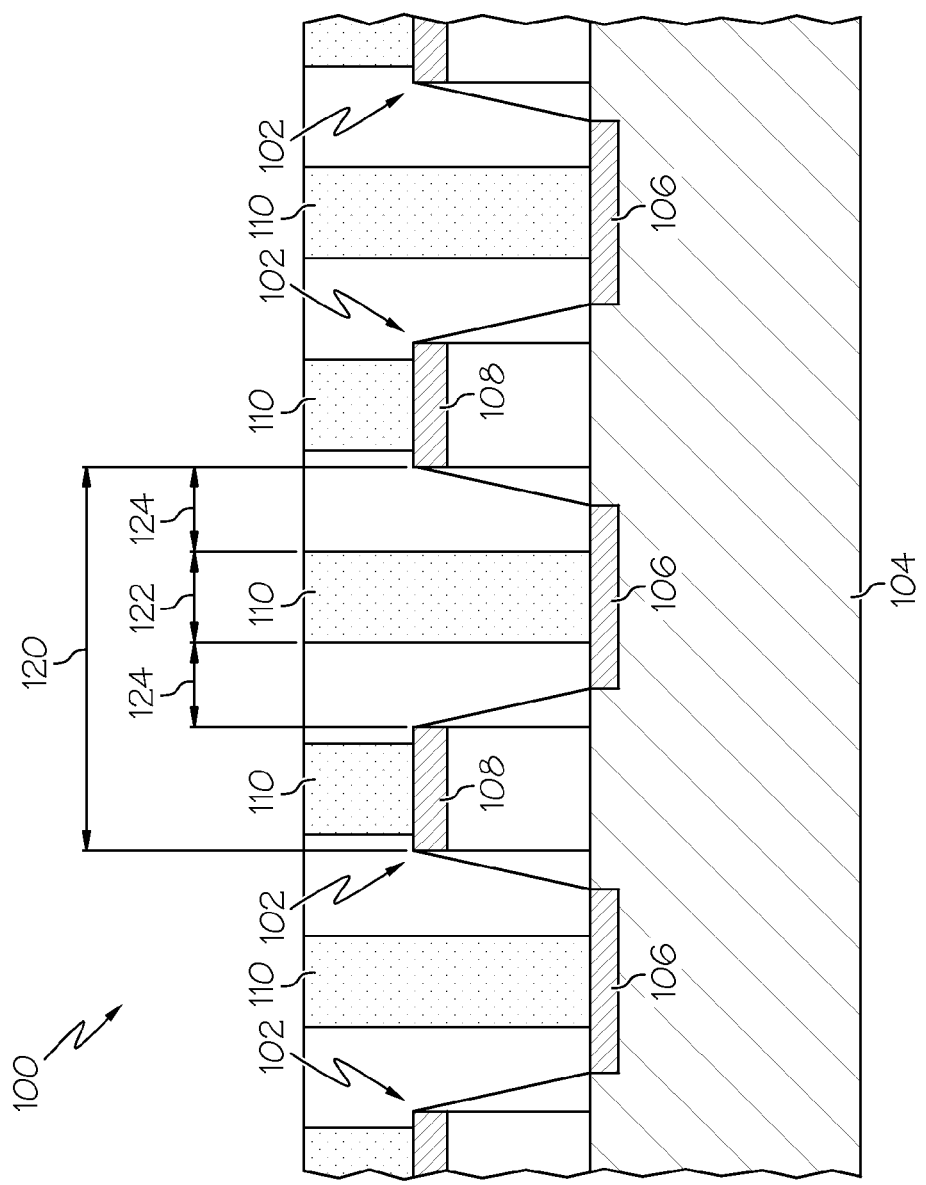
FIG. 1 is a simplified cross sectional view of a conventional semiconductor transistor device structure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

In addition, certain terminology may be used in the following description for the purpose of reference only, and thus are not intended to be limiting. For example, terms such as "upper," "lower," "above," and "below" refer to directions in the drawings to which reference is made. Terms such as "front," "back," "rear," "side," "outboard," and "inboard" describe the orientation and/or location of portions of a feature or element within a consistent but arbitrary frame of reference which is made clear by reference to the text and the associated drawings describing the feature or element under discussion. Such terminology may include the words specifically mentioned above, derivatives thereof, and words of similar import. Similarly, the terms "first," "second," and other such numerical terms referring to structures do not imply a sequence or order unless clearly indicated by the context.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over semiconductor material.

FIG. 1 is a simplified cross sectional view of a conventional semiconductor transistor device structure 100. This particular transistor device structure 100 includes gate structures 102 formed overlying semiconductor material 104. The portion of the semiconductor material 104 that resides under the gate structures 102 represents the channel regions of the transistors, and the portion of the semiconductor material 104 that resides adjacent to the channel regions represents the source/drain regions of the transistors (as is well understood). Silicide contact regions 106 for the source/drain regions are formed at the upper surface of the semiconductor material 104, and silicide contact regions 108 for the gate structures 102 are formed at the top of each gate electrode. Electrically conductive plugs 110 are formed in dielectric material that covers the gate structures 102 and the semiconductor material 104. As shown in FIG. 1, conductive plugs 110 may be used to establish electrical connections with the silicide contact regions 106 and the silicide contact regions 108.

The arrow 120 indicates the gate pitch of the transistor device structure 100, and the arrow 122 indicates the width of a conductive plug 110. The arrows 124 indicate the plug-to-gate distance. As semiconductor fabrication processes become more advanced, smaller device features can be formed. For example, using a typical 45 nanometer (nm) process technology, the gate pitch 120 has a lower limit of about 190 nm and the plug width 122 has a lower limit of about 50 nm. Using a typical 22 nm process technology, however, the gate pitch 120 can shrink to about 100 nm and the plug width 122 can shrink to about 30 nm. Unfortunately, with the gate pitch 120 scaling down smaller and smaller with each new generation of process technology, shorting between conductive source/drain plugs and gate structures becomes more and more likely (due to practical factors such as limitations of photolithographic tools, alignment tolerances, etching tolerances, etc.). Moreover, parasitic capacitance between conductive source/drain plugs and gate structures increases as the plug-to-gate distance 124 shrinks.

In future manufacturing process technologies, it may be difficult or impossible to squeeze conductive source/drain plugs between two adjacent gate structures (due to the very short gate pitches contemplated by new generation process technologies). Moreover, it may be undesirable or impossible to further reduce the plug width 122 of the conductive plugs 110 because doing so could increase the resistance of the conductive plugs 110, resulting in performance degradation (e.g., lower AC operating frequency).

The techniques and technologies described below can be employed to fabricate semiconductor transistor devices having back side conductive plugs (source/drain plugs and/or gate plugs). As used here, a "back side" conductive plug is one that is formed from the bottom side of the substrate or wafer, rather than from the top side. In this regard, a back side conductive plug is formed (at least in part) through the semiconductor material over which the gate structures are formed. Consequently, conductive source/drain plugs need not be formed in the space between adjacent gate structures (as depicted in FIG. 1). Thus, gate pitch can be scaled down even further with little to no risk of shorts between the conductive source/drain plugs and the gate structures. Moreover, the use of back side conductive source/drain plugs eliminates or significantly reduces the parasitic capacitance between conductive source/drain plugs and the gate structures (especially at 22 nm node technology and beyond).

Figure 2:
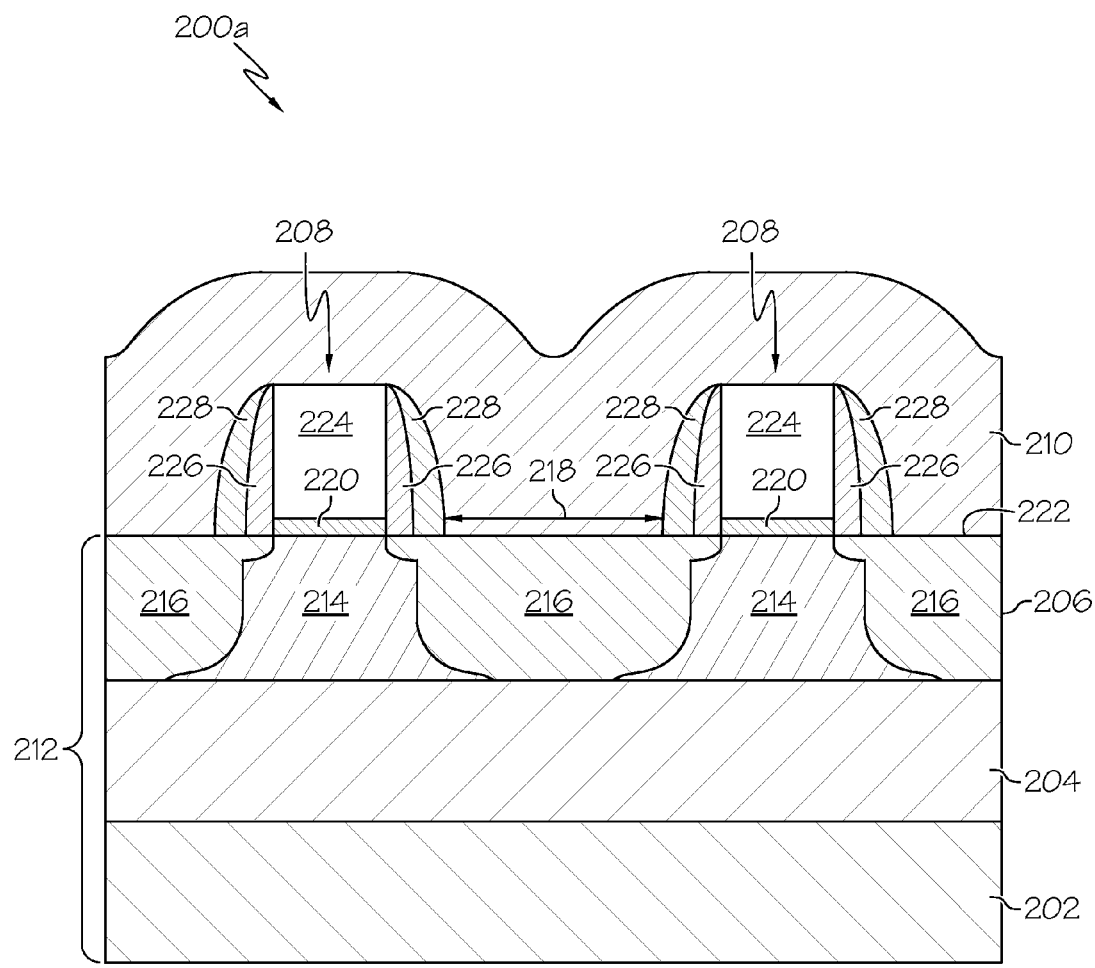
FIGS. 2-10 are cross sectional views that illustrate a semiconductor transistor device structure and a related manufacturing process.

FIGS. 2-10 are cross sectional views that illustrate a semiconductor transistor device structure 200 and a related manufacturing process. FIG. 2 depicts the device structure 200a after several preliminary and conventional process steps have been completed. At the state shown in FIG. 2, the device structure 200a includes: a support layer 202; an insulating layer 204 overlying the support layer 202; a layer of semiconductor material 206 overlying the insulating layer 204; gate structures 208 overlying the layer of semiconductor material 206; and at least one layer of material 210 overlying the gate structures 208 (as explained in more detail below, this material 210 need not be used in all embodiments).

Figure 9:
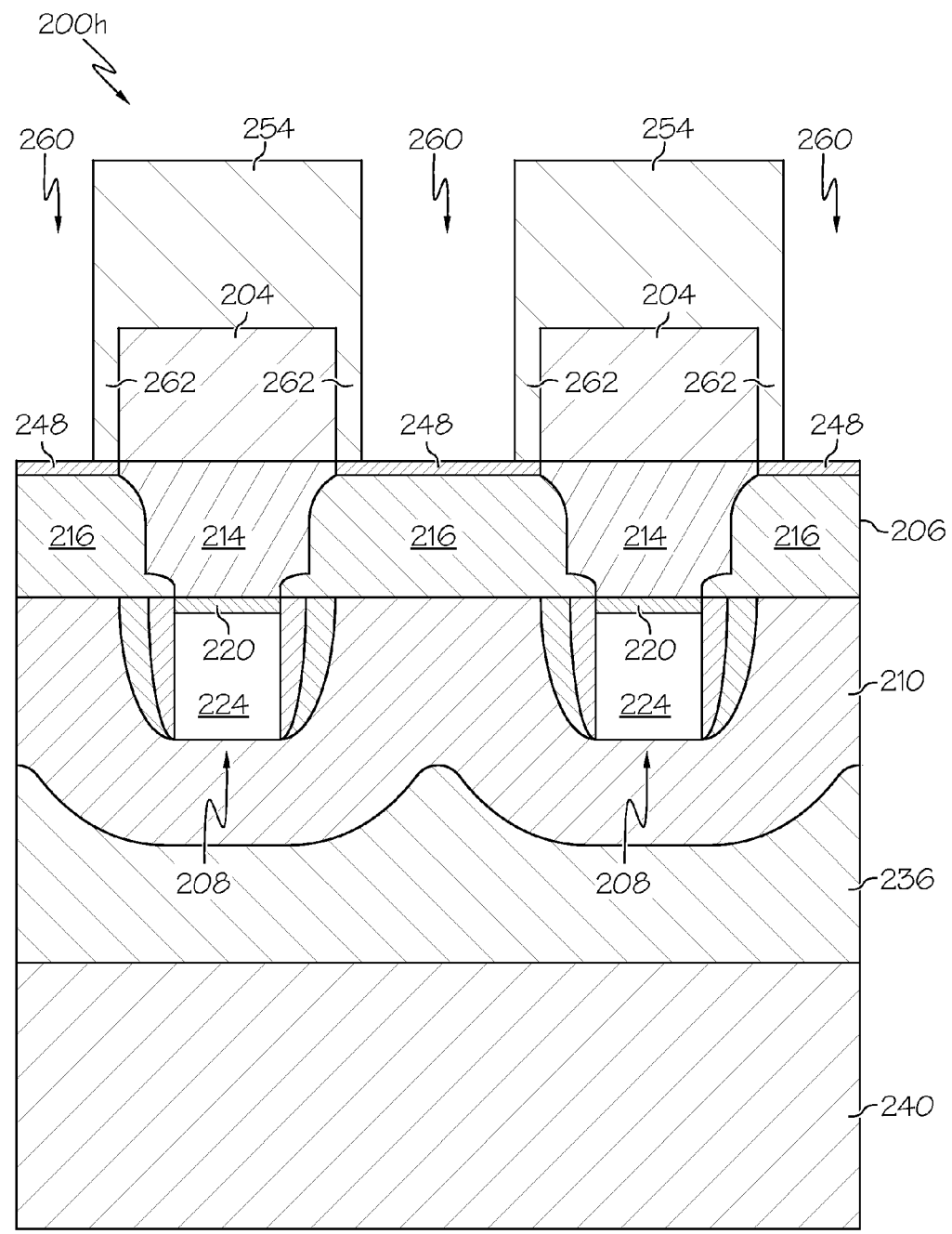
Figure 10:
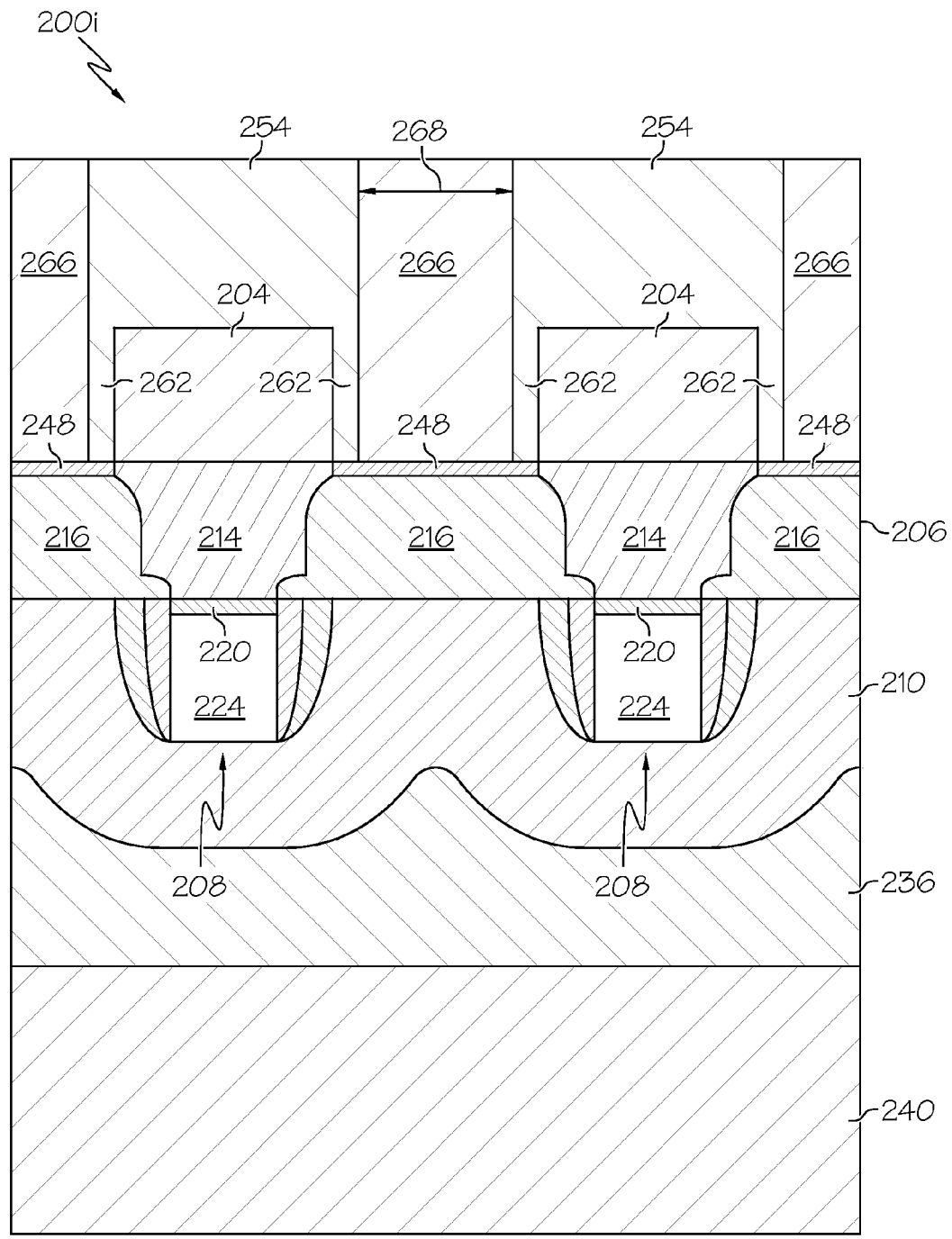
Figure 11:
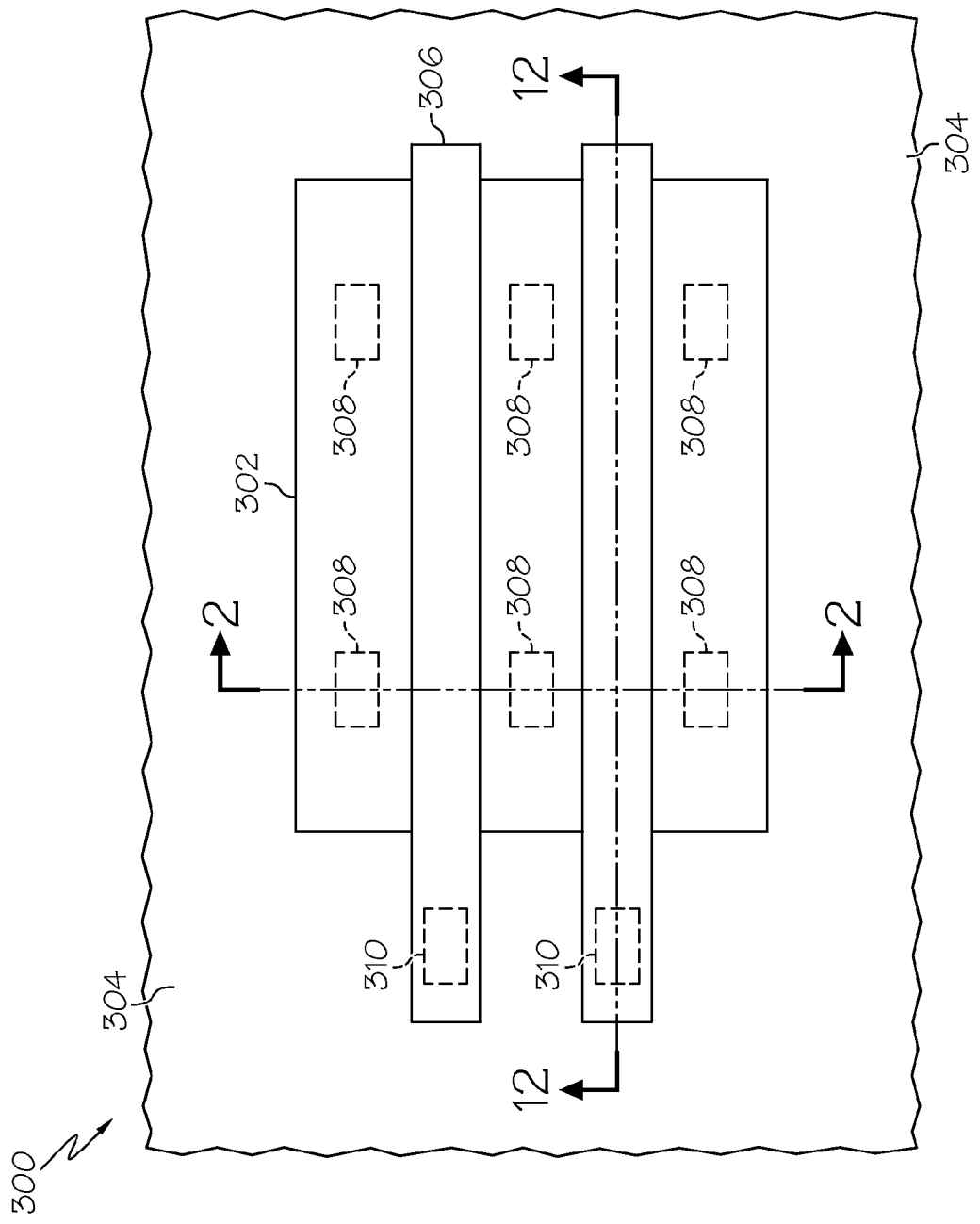
FIG. 11 is a simplified top view of a semiconductor transistor device structure.

FIGS. 2-10 correspond to a cross sectional view taken through an active region of the semiconductor material 206. In practice, the active region of the semiconductor material 206 could be surrounded or otherwise bordered by a suitable isolation material such as shallow trench isolation (STI). FIGS. 2-10 do not depict any STI regions, which might reside further to the left or right relative to the perspective of FIGS. 2-10 (and/or further into or out of the page relative to the perspective of FIGS. 2-10). FIG. 11, however, depicts STI for an exemplary semiconductor transistor device structure 300. With brief reference to FIG. 11, the semiconductor transistor device structure 300 includes an active region of semiconductor material 302 surrounded by STI 304, which is located outboard of the semiconductor material 302. This embodiment of the semiconductor transistor device structure 300 includes two gate structures 306, which run across the semiconductor material 302, as shown. FIGS. 2-10 represent a view taken along a cross sectional line that is perpendicular to the major longitudinal dimension of the gate structures, such as line 2-2 shown in FIG. 11.

For the illustrated embodiment, the device structure 200a is formed using a semiconductor-on-insulator (SOI) substrate 212 or wafer, which includes the support layer 202, the insulating layer 204, and the layer of semiconductor material 206. In alternate embodiments, the device structure 200a can be formed on a bulk semiconductor substrate rather than an SOI substrate, although some of the techniques, process steps, and/or device features described below may need to be modified or supplemented to accommodate a bulk implementation. Although any suitable semiconductor material may be employed, for this embodiment the semiconductor material 206 is a silicon material, where the term "silicon material" is used herein to encompass the generally monocrystalline and relatively pure silicon materials typically used in the semiconductor industry, as well as silicon admixed with other elements such as germanium, carbon, and the like. Alternatively, the semiconductor material 206 can be germanium, gallium arsenide, or the like. The semiconductor material 206 can originally be either n-type or p-type silicon, but is typically p-type, and the semiconductor material 206 is subsequently doped in an appropriate manner to form active regions. The active regions can be used for the source and drain regions of the resulting transistor devices.

The support layer 202 may be, for example, the carrier wafer of the SOI substrate 212. Thus, for this exemplary embodiment the support layer 202 is formed from a silicon material. The insulating layer 204 can be formed from one or more layers of any suitable dielectric material or composition. For consistency with the orientation of FIG. 2, the insulating layer 204 may be considered to be a lower layer of dielectric material (relative to overlying features such as the first upper layer of material 210). In practice, the insulating layer 204 is formed from a single layer of dielectric material such as an oxide material. In this regard, the insulating layer 204 may be realized as a buried oxide (BOX) layer of the SOI substrate 212, as is well understood. Moreover, the layer of semiconductor material 206 corresponds to the semiconductor layer (e.g., a silicon material) of the SOI substrate 212. In certain exemplary embodiments, the insulating layer 204 has a thickness of about 10-200 nm (typically, about 150 nm).

Any number of conventional semiconductor manufacturing steps and/or fabrication modules can be utilized to obtain and provide the device structure 200a depicted in FIG. 2. These process steps and techniques may include, without limitation: STI formation; well implantation; gate structure creation; inner spacer formation; halo and extension ion implantation; final spacer formation; source/drain ion implantation; and thermal activation of implanted dopants (e.g., rapid thermal annealing, laser spike annealing, flash annealing, or the like). Notably, the conventional and usual steps related to the formation of silicide contacts are omitted. Instead, the material 210 can be formed overlying the gate structures 208 and the layer of semiconductor material 206 following source/drain implantation if so desired. It should be appreciated that other conventional and optional process steps could be performed to create various device features, structures, implant regions, and/or other characteristics that are not shown in FIG. 2 or described in detail here. For example, the device structure 200a may, but need not, employ one or more of the following features, without limitation: embedded source/drain stressor regions, such as epitaxial silicon germanium in PMOS source/drain regions and/or epitaxial silicon carbide in NMOS source/drain regions.

As is well understood, the layer of semiconductor material 206 will have defined therein channel regions 214 and source/drain regions 216. Each channel region 214 resides below a respective gate structure 208, and each source/drain region 216 is adjacent to a channel region 214. Notably, one source/drain region 216 could be shared by two neighboring transistors (see the center source/drain region 216 of FIG. 2). Indeed, in certain embodiments at least a portion of each source/drain region 216 is located under a separation space 218 between two adjacent gate structures 208, where the separation space 218 is defined by the particular arrangement and layout used for the device structure 200.

Although any particular configuration and arrangement of materials can be used for the gate structures 208, in the illustrated embodiment each gate structure 208 includes a gate insulator layer 220 overlying the upper surface 222 of the layer of semiconductor material 206, and includes a conductive gate element 224 overlying the gate insulator layer 220. Thus, the gate insulator layer 220 is located between the conductive gate element 224 and the layer of semiconductor material 206. For reasons that will become apparent from the following description, the conductive gate elements 224 are arranged and created such that at least their lower sections are formed from a highly electrically conductive material, such as a metal material. In certain embodiments, the entire conductive gate element 224 is formed from the same metal material, such as titanium nitride. In other embodiments, it may be possible to form an initial gate metal layer (e.g., a titanium nitride layer) overlying the gate insulator layer 220, followed by at least one secondary layer of another material (e.g., polycrystalline silicon, amorphous silicon, tungsten, a tungsten-silicon material, or the like). The illustrated embodiment also employs inner spacers 226 and outer spacers 228 formed on the sidewalls of the gate structures 208. These spacers 226 and 228 can be used for ion implant masking, self-aligned process steps such as etching, and other conventional purposes.

After the gate structures 208 and the spacers 226 and 228 have been formed, the overlying material 210 can be formed. In practice, the material 210 may include one or more layers of different composition, and the material 210 can be realized as a single stress liner, a dual stress liner, a passivation layer, and/or other layers. In certain embodiments, the material 210 is formed using one or more layers of dielectric material. As depicted in FIG. 2, the material 210 may include a nitride material that is conformally deposited such that the resulting material 210 generally follows the contour of the underlying device structures. In certain exemplary embodiments, the material 210 is deposited such that it has a thickness of about 10-1000 nm (typically, about 50 nm) measured from the top of the gate structures 208.

Figure 3:
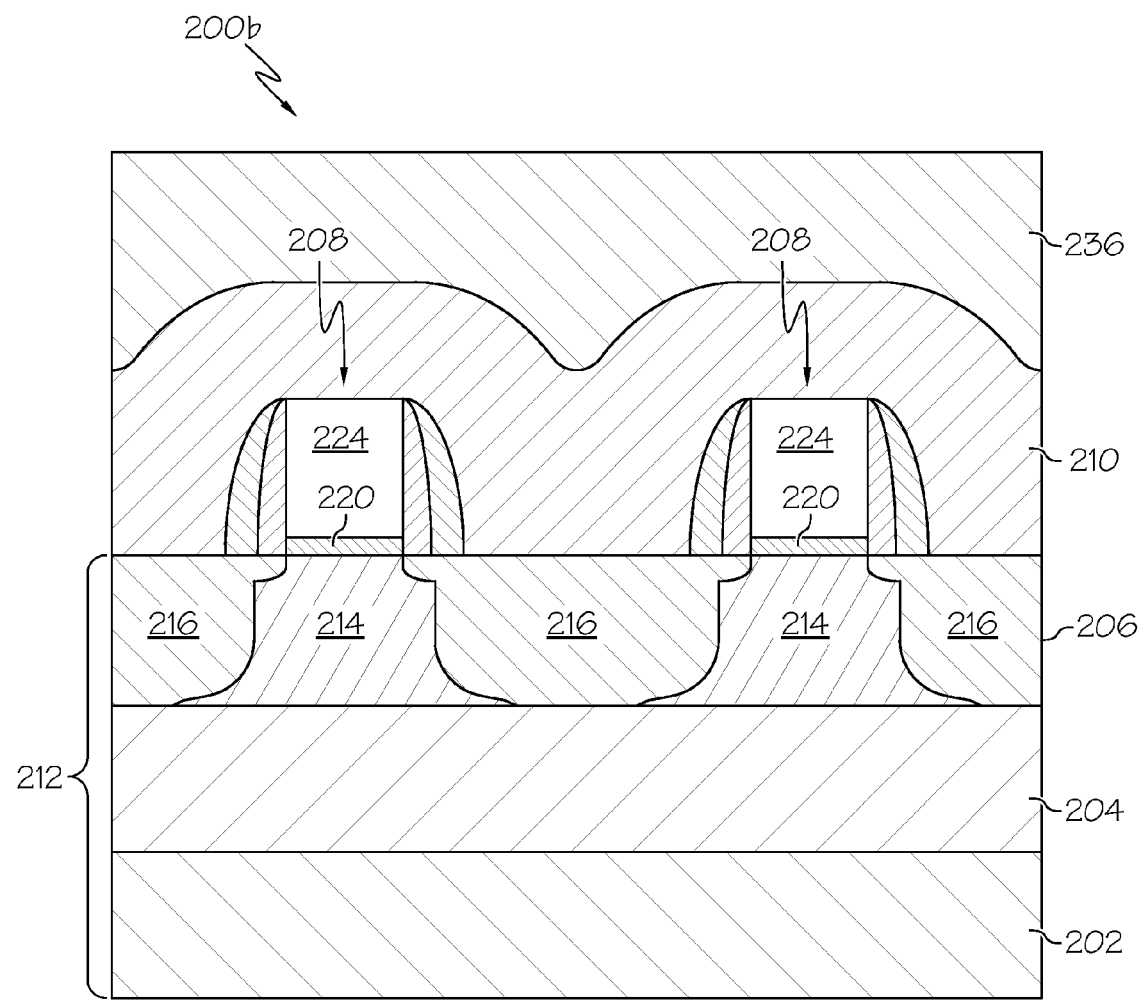

Although other fabrication steps or sub-processes may be performed after the device structure 200a has been provided, this example continues by forming a layer of dielectric material 236 overlying the material 210. FIG. 3 shows the state of the device structure 200b after the dielectric material 236 has been formed and after its exposed surface has been planarized or polished. It should be appreciated that the material 210 and the dielectric material 236 may each be considered to be an upper layer of dielectric material, relative to the "lower" insulating layer 204. Moreover, an embodiment of the device structure 200 could be formed using more than two upper layers of dielectric material, and the device structure 200b depicted in FIG. 3 is just one possible arrangement.

The dielectric material 236 will typically be of a different composition than the underlying material 210. In this regard, when nitride is used for the material 210, then the dielectric material 236 will typically be an oxide material. In practice, the dielectric material 236 can be conformally deposited overlying the material 210 using any conventional technique such as, and without limitation: chemical vapor deposition (CVD), low pressure chemical vapor deposition (LPCVD), or plasma enhanced chemical vapor deposition (PECVD). The dielectric material 236 is deposited to an appropriate thickness such that the underlying contours and valleys in the material 210 are filled, and such that the dielectric material 236 can be effectively planarized. After the dielectric material 236 has been formed, its exposed surface (which corresponds to the front side of the host wafer) can be polished or planarized using conventional tools and techniques such as, for example, chemical mechanical polishing. In certain exemplary embodiments, the dielectric material 236 is deposited and then planarized such that it has a resulting thickness of about 100-500 nm (typically, about 200 nm) measured from the highest point of the material 210.

Figure 4:
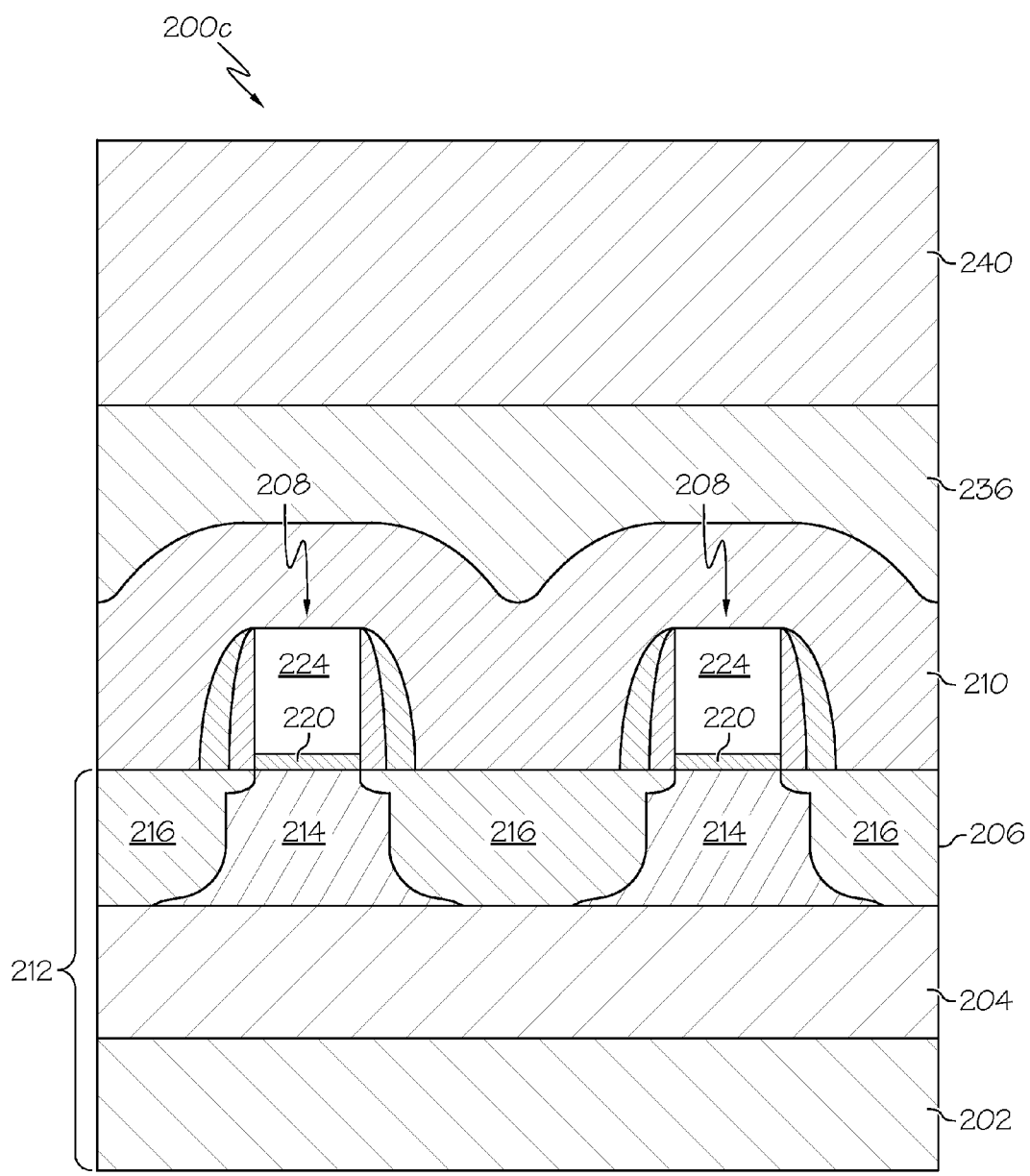

Although other fabrication steps or sub-processes may be performed after formation of the dielectric material 236, this example continues by forming a support substrate 240 overlying the dielectric material 236. FIG. 4 shows the state of the device structure 200c after the support substrate 240 has been formed. For reasons that will become apparent from the following description, the support substrate 240 is realized as a relatively thick film or sheet of material that has sufficient structural rigidity and toughness. Moreover, in certain embodiments the support substrate 240 is realized from a material that is highly thermally conductive, such that the support substrate 240 can also serve as a heat sink for the resulting device structure 200. In this regard, the support substrate 240 may be formed from a metal film (e.g., copper, aluminum, or the like) that is bonded or otherwise coupled to the exposed surface of the dielectric material 236. Thus, in contrast to conventional transistor device structures that are coupled to a heat sink from the back side (relative to the wafer orientation), the device structure 200 can be coupled to a heat sink from the front side. In certain exemplary embodiments, the support structure 240 has a thickness of about 50-500 nm.

Figure 5:
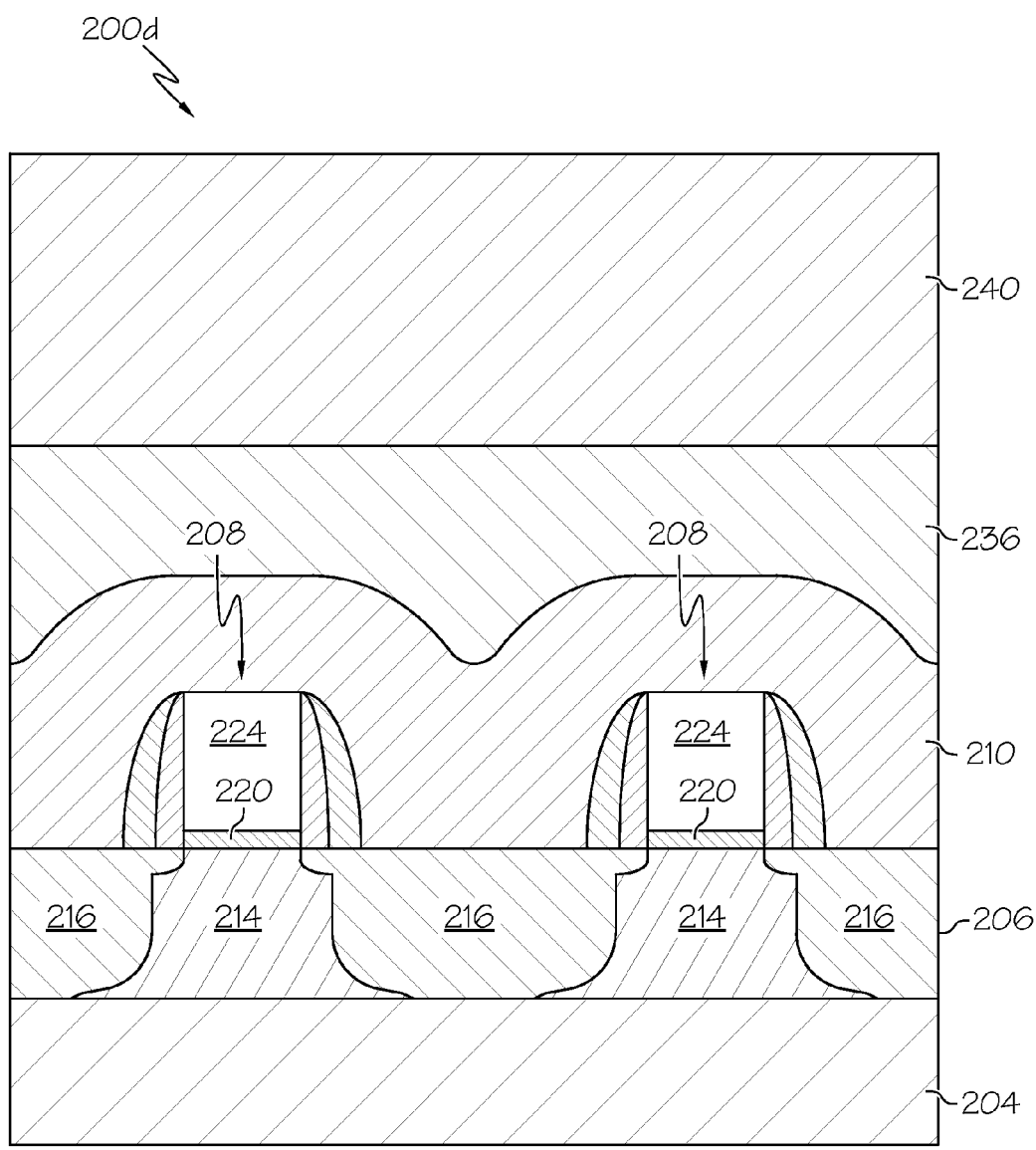

Although other fabrication steps or sub-processes may be performed after the support substrate 240 is in place, this example continues by removing the support layer 202 of the SOI substrate 212. FIG. 5 shows the state of the device structure 200d after removal of the support layer 202. Removal of the support layer 202 without the presence of the support substrate 240 would make the device structure 200 too weak. For this reason, the support substrate 240 is set before removing the support layer 202. The support layer 202 can be polished or planarized away using conventional tools and techniques such as, for example, chemical mechanical polishing, and/or a selective chemical etch that stops on the insulating layer 204 with high selectivity between the support substrate 240 and the insulating layer 204. In practice, the planarizing/polishing tool can utilize an appropriate endpoint detection technique that detects when the insulating layer 204 has been reached. In addition, the process can use a suitable polishing slurry that selectively removes the support layer 202 without substantially removing any of material used for the insulating layer 204.

Figure 6:
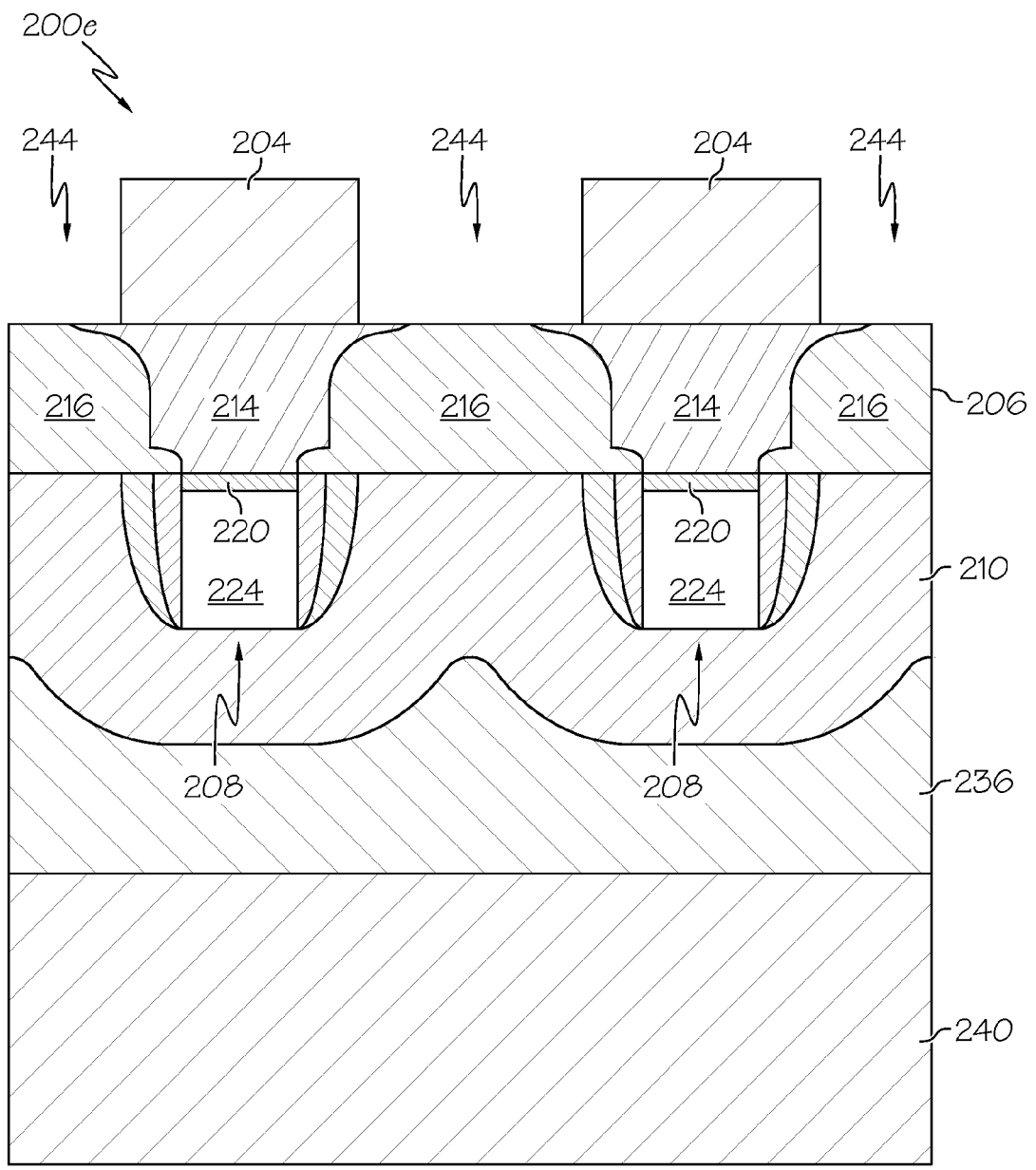

Although other fabrication steps or sub-processes may be performed after removal of the support layer 202, this example continues by creating recesses in the insulating layer 204. FIG. 6 shows the state of the device structure 200e after the host wafer has been flipped, and after formation of the recesses 244. It should be appreciated that FIG. 6 (and FIGS. 7-10) depicts the back side of the wafer at the top of the page, and the front side of the wafer at the bottom of the page. The orientation of FIGS. 6-10 is consistent with the actual orientation of the wafer during the associated process steps.

The recesses 244 are created to expose selective portions of the semiconductor material 206. More specifically, the recesses 244 terminate at the layer of semiconductor material 206 that corresponds to (or is proximate to) the source/drain regions 216. Thus, each recess 244 will be generally located overlying at least the center or middle portion of a respective source/drain region 216. In certain embodiments, the recesses 244 are formed by etching the insulating layer 204 with an etchant that is selective to the material used for the insulating layer 204. For example, insulating layer 204 can be anisotropically etched to form the desired layout of recesses 244 by, for example, reactive ion etching (RIE) using a $CHF_3$, $CF_4$, $SF_6$, or other suitable chemistry. As is well understood, an appropriately patterned etch mask (not shown) is used to protect some of the underlying semiconductor material 206, and the etch mask will have features that define the recesses 244. When fabricating the etch mask, the existing gate structures 208 can be used for purposes of alignment to ensure that the etch mask features accurately and precisely align with the desired locations for the recesses 244. FIG. 6 depicts the state of the device structure 200e after the recesses 244 have been etched and after removal of the etch mask.

Figure 7:
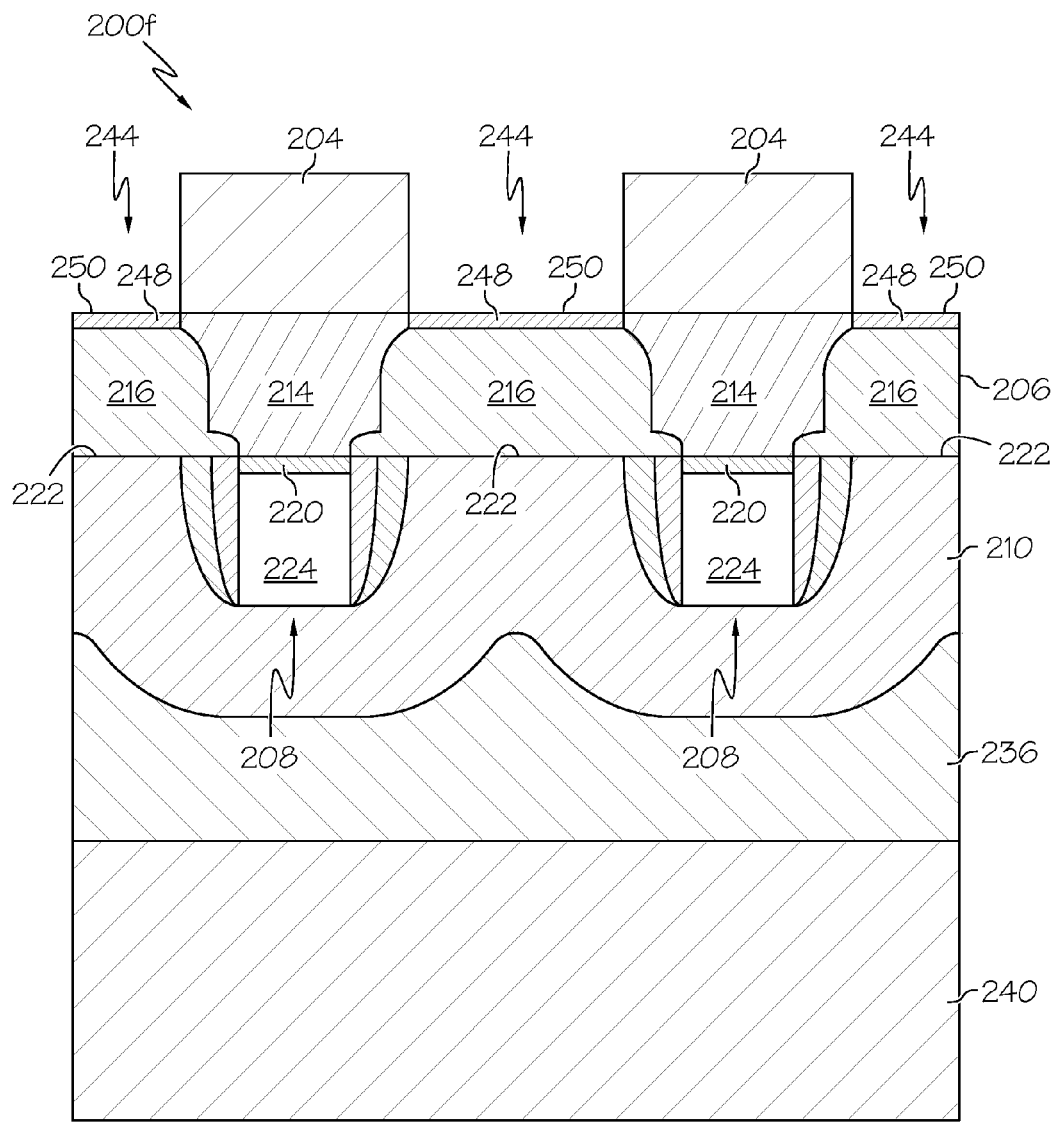

Although other fabrication steps or sub-processes may be performed after formation of the recesses 244, this example continues by forming electrically conductive contact elements 248 for the source/drain regions 216. The contact elements 248 may be coupled to, connected to, formed in, or formed from the source/drain regions 216. FIG. 7 shows the state of the device structure 200f after creation of the contact elements 248. When the host wafer is oriented with its front side up and its back side down (see FIGS. 2-5), the conductive contact elements 248 reside below the upper surface 222 of the layer of semiconductor material 206 (in FIG. 7, however, the contact elements 248 appear above the upper surface 222). More specifically, the conductive contact elements 248 are formed at or near the lower surface 250 of the layer of semiconductor material 206.

It should be understood that FIG. 7 depicts the device structure 200f after a number of known process steps have been performed. For the sake of brevity, these intermediate steps will not be described in detail. The state of the device structure 200f depicted in FIG. 7 may be obtained by performing an appropriate silicidation process to create metal silicide regions from the exposed semiconductor material located at the bottom of the recesses 244. For example, a layer of silicide-forming metal (not shown) can be deposited onto the exposed surfaces of the semiconductor material 206. The silicide-forming metal can be deposited, for example, by sputtering to a thickness of about 5-50 nm and preferably to a thickness of about 10 nm. The device structure may then be heated, for example by rapid thermal annealing, to form the metal silicide contact elements 248, which will be physically and electrically coupled with the source/drain regions 216. The silicide-forming metal can be, for example, cobalt, nickel, rhenium, ruthenium, or palladium, or alloys thereof. Any silicide-forming metal that is not in contact with exposed silicon does not react during heating and, therefore, does not form a silicide. This excess metal may be removed by wet etching or any suitable procedure.

Figure 8:
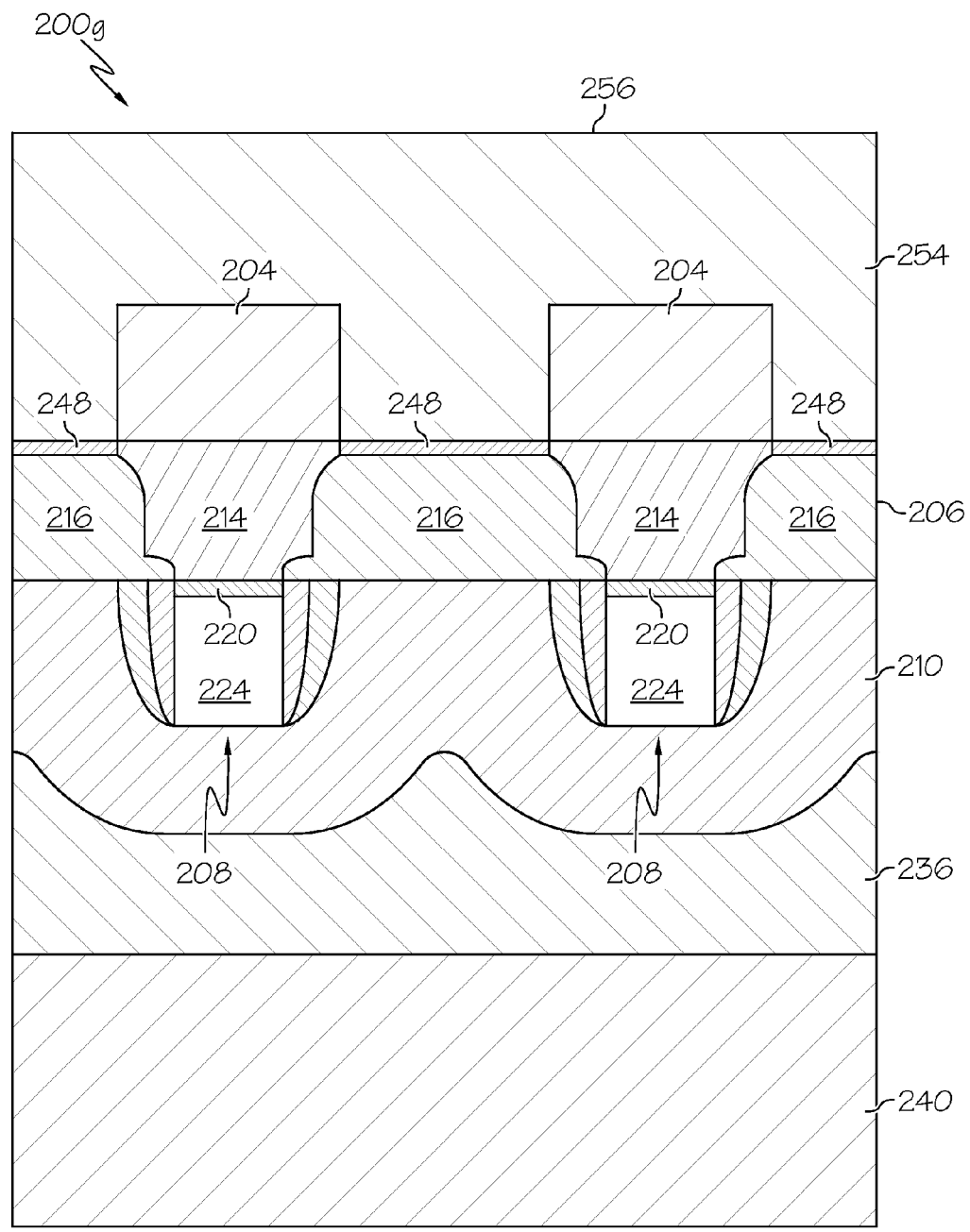

Although other fabrication steps or sub-processes may be performed after formation of the silicide contact elements 248, this example continues by forming a layer of dielectric material 254 overlying the existing device structure. FIG. 8 shows the state of the device structure 200g after fabrication of the layer of dielectric material 254. For this particular embodiment, the dielectric material 254 is deposited overlying the silicide contact elements 248 and such that it fills in the recesses 244. Moreover, the dielectric material 254 is preferably deposited to a thickness such that it also overlies the insulating layer 204, as depicted in FIG. 8. This results in some sections where the insulating layer 204 is located between the dielectric material 254 and the layer of semiconductor material 206, and other sections where no insulating layer 204 resides between the dielectric material 254 and the layer of semiconductor material 206.

The dielectric material 254 can be any appropriate insulator, such as an oxide material, typically silicon oxide. The dielectric material 254 can be deposited in a known manner by, for example, atomic layer deposition (ALD), CVD, LPCVD, semi-atmospheric chemical vapor deposition (SACVD), or PECVD. After forming the layer of dielectric material 254, its exposed surface 256 can be planarized or polished as needed. In certain embodiments, the dielectric material 254 is deposited to a thickness so that, after planarizing the exposed surface 256, the dielectric material 254 has a thickness of about 100-500 nm (typically, about 200-300 nm), measured from the top of the insulating layer 204.

Although other fabrication steps or sub-processes may be performed after the dielectric material 254 is in place, this example continues by creating vias (holes) 260 in the dielectric material 254. FIG. 9 shows the state of the device structure 200h after formation of the vias 260. The vias 260 are created to expose some or all of the silicide contact elements 248. In other words, each via 260 is formed such that it terminates at a respective silicide contact element 248. In certain embodiments, the vias 260 are formed by etching the dielectric material 254 with an etchant that is selective to the dielectric material 254. For example, the dielectric material 254 can be anisotropically etched to form the desired layout of vias 260 by, for example, RIE using a $CHF_3$, $CF_4$, $SF_6$, or other suitable chemistry. Due to the selective nature of the etch chemistry, the silicide contact elements 248 may serve as an etch stop material for this etching step. As is well understood, an appropriately patterned etch mask (not shown) is used to protect some of the underlying dielectric material 254, and the etch mask will have features that define the vias 260. FIG. 9 depicts the state of the device structure 200h after the vias 260 have been etched and after removal of the corresponding etch mask.

For this exemplary embodiment, the vias 260 are sized and shaped such that creation of the vias 260 results in respective dielectric sleeves 262 formed from the dielectric material 254. In other words, each via 260 fits within the space formerly defined by one of the recesses 244, with an amount of clearance or space remaining around that via 260. Thus, when the vias 260 are etched, an amount of the dielectric material 254 remains between the vias 260 and the sidewalls of the insulating layer 204. In other embodiments, the vias 260 could be sized and shaped such that they are precisely aligned with the sidewalls of the patterned insulating layer 204 and, therefore, such that no dielectric sleeves 262 are formed.

Although other fabrication steps or sub-processes may be performed after the creation of the vias 260, this example continues by filling the vias 260 with an electrically conductive material to form conductive plugs 266 for the source/drain regions 216. FIG. 10 shows the state of the device structure 200i after formation of the conductive plugs 266. For the embodiment depicted in FIG. 10, each conductive plug 266 extends through the dielectric material 254, and at least a portion of each conductive plug 266 extends through the insulating layer 204. More specifically, at least a portion (the lowermost portion, relative to the orientation of FIG. 10) of each conductive plug resides in a dielectric sleeve 262. Each conductive plug 266 terminates at, and is electrically coupled to, a respective silicide contact element 248.

In certain embodiments, the conductive plugs 266 are formed from a highly electrically conductive material such as a metal material, typically tungsten, copper, or an alloy thereof. The conductive material can be deposited using a conformal deposition technique, such as an appropriate CVD or physical vapor deposition (PVD) technique. During this deposition step, some amount of the electrically conductive plug material may be deposited over the exposed dielectric material 254. This overburden material can be removed from the device structure 200i by polishing, planarizing, or the like. In this regard, FIG. 10 depicts the state of the device structure 200i after completion of such polishing/planarizing.

Notably, even if the current state of the art process technology (22 nm) is used, the width 268 of the conductive plugs 266 can exceed the typical plug width 122 (see FIG. 1) that can be realized using front side plugs. For example, the conductive plugs 266 may be up to 45 nm wide, in contrast to the maximum width of 30 nm achievable with front side plugs using 22 nm technology. Indeed, the conductive plugs 266 can be formed as wide as their corresponding silicide contact elements 248 if so desired, with little to no risk of shorting between the conductive plugs 266 and the gate structures 208.

As mentioned previously, FIGS. 2-10 depict a cross section of the device structure 200 taken through a region of active semiconductor material. For this exemplary embodiment, FIGS. 2-10 do not depict any gate contact plugs, because they reside at a different cross sectional locations. Nonetheless, fabrication of the device structure 200 will also include the formation of gate contact plugs (preferably, back side plugs that are similar to the conductive plugs 266 used for the source/drain regions 216).

Referring again to FIG. 11, FIGS. 2-10 might correspond to the cross sectional view taken along line 2-2 in FIG. 11. The semiconductor transistor device structure 300 depicted in FIG. 11 includes an active region of semiconductor material 302 surrounded by STI 304. Two gate structures 306 are formed overlying the semiconductor material 302 and the STI 304. More specifically, at least a first section of each gate structure 306 is formed overlying the STI 304, and at least a second section of each gate structure 306 is formed overlying the active region of semiconductor material 302. FIG. 11 depicts (in dashed lines) a number of conductive source/drain plugs 308 and a number of conductive gate plugs 310. Again, the conductive gate plugs 310 are not shown in FIGS. 2-10.

FIGS. 12-16 are cross sectional views that illustrate the semiconductor transistor device structure 200 and its related manufacturing process. In particular, FIGS. 12-16 illustrate the manner in which conductive gate plugs can be fabricated for the device structure 200. In this regard, the process steps described here with reference to FIGS. 12-16 can be performed concurrently with their counterpart or equivalent process steps, which were described previously with reference to FIGS. 2-10. FIGS. 12-16 correspond to a cross sectional view taken longitudinally through a gate structure that spans both an isolation region (e.g., STI) and an active semiconductor region of the device structure 200. In this regard, FIGS. 12-16 could represent a view taken along line 12-12 shown in FIG. 11.

Figure 12:
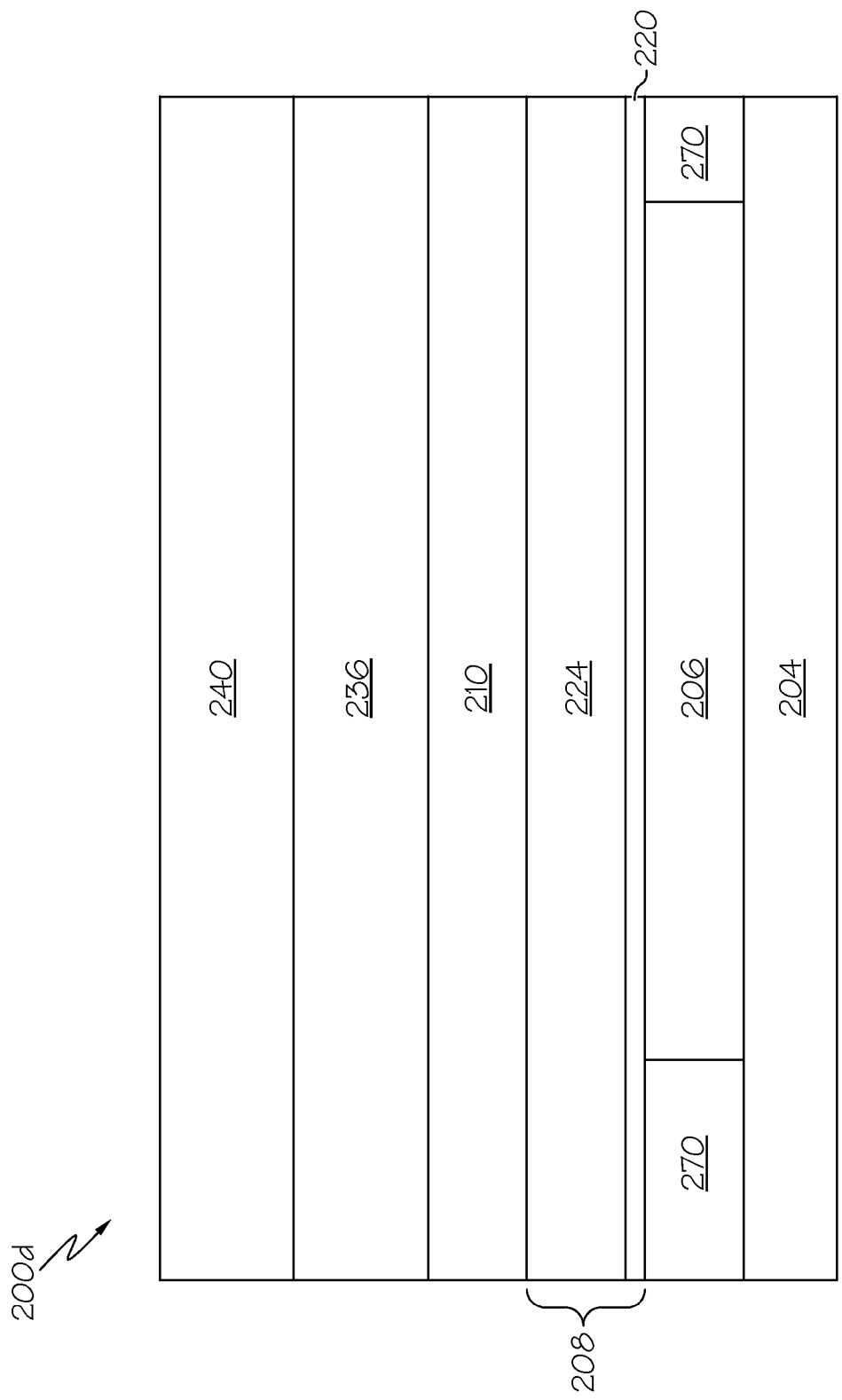
FIGS. 12-16 are cross sectional views that illustrate a semiconductor transistor device structure and a related manufacturing process.

FIG. 12 depicts the semiconductor transistor device structure 200$d$ in the same state shown in FIG. 5, but from a different cross sectional perspective. To briefly summarize, the device structure 200$d$ at this stage of the manufacturing process includes, without limitation: the insulating layer 204 (e.g., BOX); the layer of semiconductor material 206; a gate structure 208 (which includes a gate insulator layer 220 and a conductive gate element 224 overlying the gate insulator layer); material 210 overlying the gate structure 208; the layer of dielectric material 236 overlying the material 210; and the support substrate 240 coupled to the layer of dielectric material 236. Notably, FIG. 12 also depicts an isolation region 270 (e.g., STI) that is not shown in any of FIGS. 2-10. This isolation region 270 is formed overlying the insulating layer 204 such that it surrounds and isolates the layer of semiconductor material 206. FIG. 12 illustrates how most of the gate structure 208 passes over the layer of semiconductor material 206, and how the ends of the gate structure 208 pass over the isolation region 270.

Figure 13:
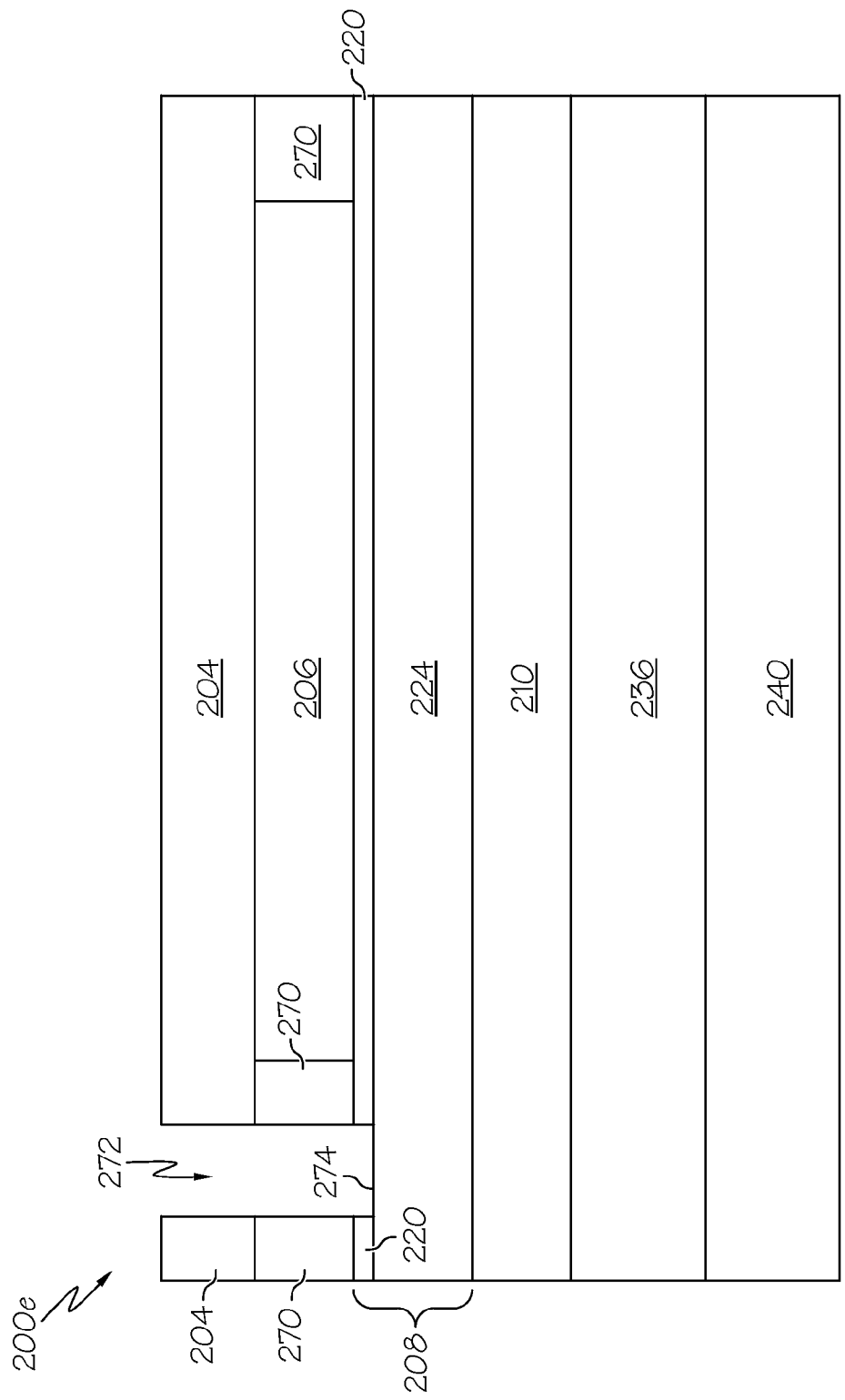

FIG. 13 depicts the semiconductor transistor device structure 200$e$ in the same state shown in FIG. 6, but from a different cross sectional perspective. FIG. 13, however, depicts the device structure 200$e$ after the creation of a recess 272 for the gate structure 208 (which can be compared to the recesses 244 shown in FIGS. 2-10). In practice, any number of recesses 272 can be formed at various locations on the device structure 200$e$, as needed. For the sake of brevity, only one recess 272 is shown and described here. As shown in FIG. 13, the recess 272 is formed such that it passes through the insulating layer 204, through the isolation region 270, and through the gate insulator layer 220 to expose a section 274 of the conductive gate element 224. In other words, the recess 272 is formed such that it terminates at the conductive gate element 224. As is well understood, an appropriately patterned etch mask (not shown) is used to etch the recess 272, and that etch mask will have features that define the recesses 272.

It should be appreciated that the etching chemistry, technique, and/or steps used to form the recess 272 may differ from that used to form the recesses 244 (see FIG. 5). Recall that the recesses 244 can be formed by selectively etching the insulating layer 204, and then stopping at the layer of semiconductor material 206. In contrast, the recess 272 can be created by selectively etching the insulating layer 204, the isolation region 270, and the gate insulator layer 220, and then stopping at the conductive gate element 224. Since these two etching processes need to etch different materials, they may require different etch chemistries. Accordingly, it may be necessary to perform two separate etching steps (with appropriate etch masks used) to form the recesses 244 and the recess 272. In certain embodiments, however, it may be possible to form the recesses 244 and 272 concurrently if the etching selectivity to silicide is adequately high (there should be little to no silicide erosion by the chosen etching technique and chemistry).

Figure 14:
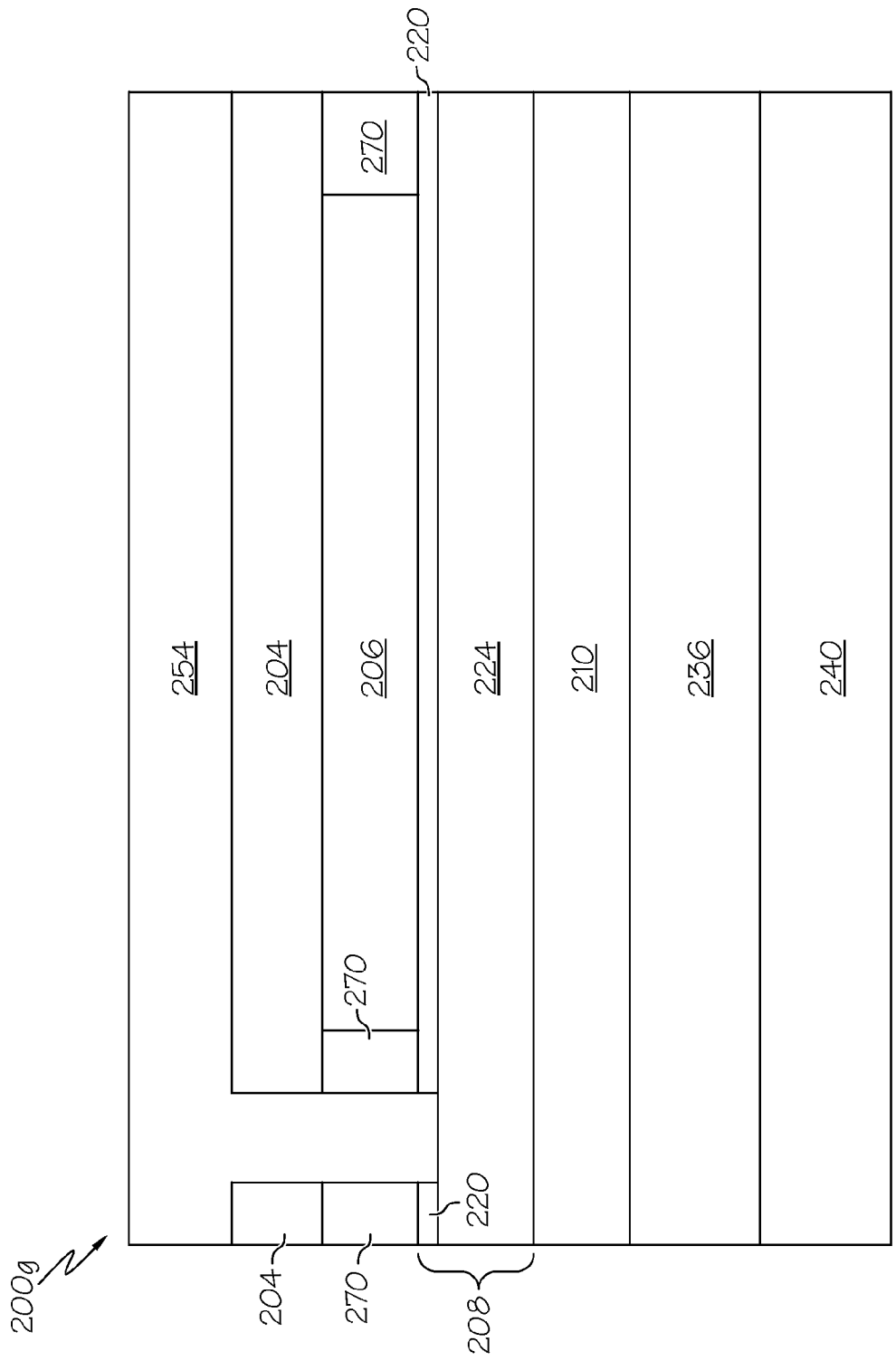

FIG. 14 depicts the semiconductor transistor device structure 200$g$ in the same state shown in FIG. 8, but from a different cross sectional perspective. For this embodiment, a silicide contact is not required for the gate structure 208 because the recess 272 terminates at the conductive gate element 224 (which, as described above, is preferably a highly electrically conductive metal material). Consequently, silicide need not be formed at the conductive gate element 224, and the dielectric material 254 can be deposited such that it fills the recess 272. As mentioned above with reference to FIG. 8, the dielectric material 254 is formed overlying the insulating layer 204, and it may be planarized after deposition.

Figure 15:
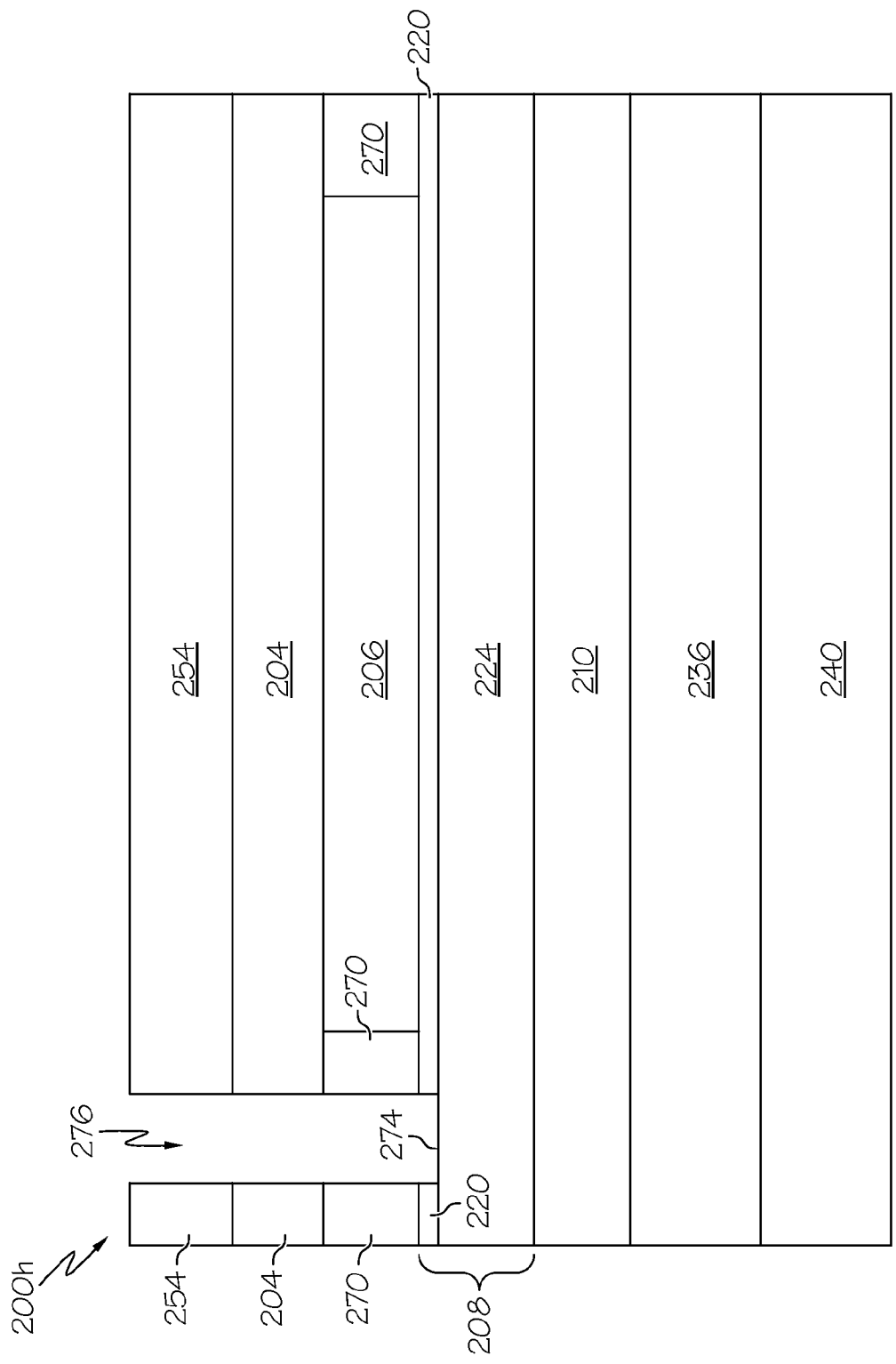

FIG. 15 depicts the semiconductor transistor device structure 200$h$ in the same state shown in FIG. 9, but from a different cross sectional perspective. FIG. 15, however, shows a via 276 that has been formed for the gate structure 208. This via 276 is created to expose the section 274 of the conductive gate element 224. In other words, the via 276 is formed such that it terminates at the conductive gate element 224. As explained above with reference to FIG. 9, the via 276 can be formed by etching the dielectric material 254 with an etchant that is selective to the dielectric material 254. Due to the selective nature of the etch chemistry, the conductive gate element 224 may serve as an etch stop material for this etching step. As is well understood, an appropriately patterned etch mask (not shown) can be used to form the via 276, and this etch mask will have features that define the vias 276. FIG. 15 depicts the state of the device structure 200$h$ after the via 276 has been etched and after removal of the corresponding etch mask.

Although not shown in FIG. 15, the via 276 could be sized and shaped such that creation of the via 276 results in a respective dielectric sleeve formed from the dielectric material 254 (similar to the dielectric sleeve 262 shown in FIG. 9). In the illustrated embodiment, however, the via 276 is sized and shaped such that it is precisely aligned with the sidewalls that defined the recess 272 (see FIG. 13) and, therefore, such that no dielectric sleeve is produced. In certain embodiments, the via 276 can be created by forming the dielectric material 254 on the layer of insulating material 204 (without needing to etching the recess 272). In such embodiments, the via 276 could be formed using a single step or process during which the dielectric material 254, the insulating layer 204, the isolation region 270, and the gate insulator layer 220 are etched, resulting in the device structure 200$h$ shown in FIG. 15.

Figure 16:
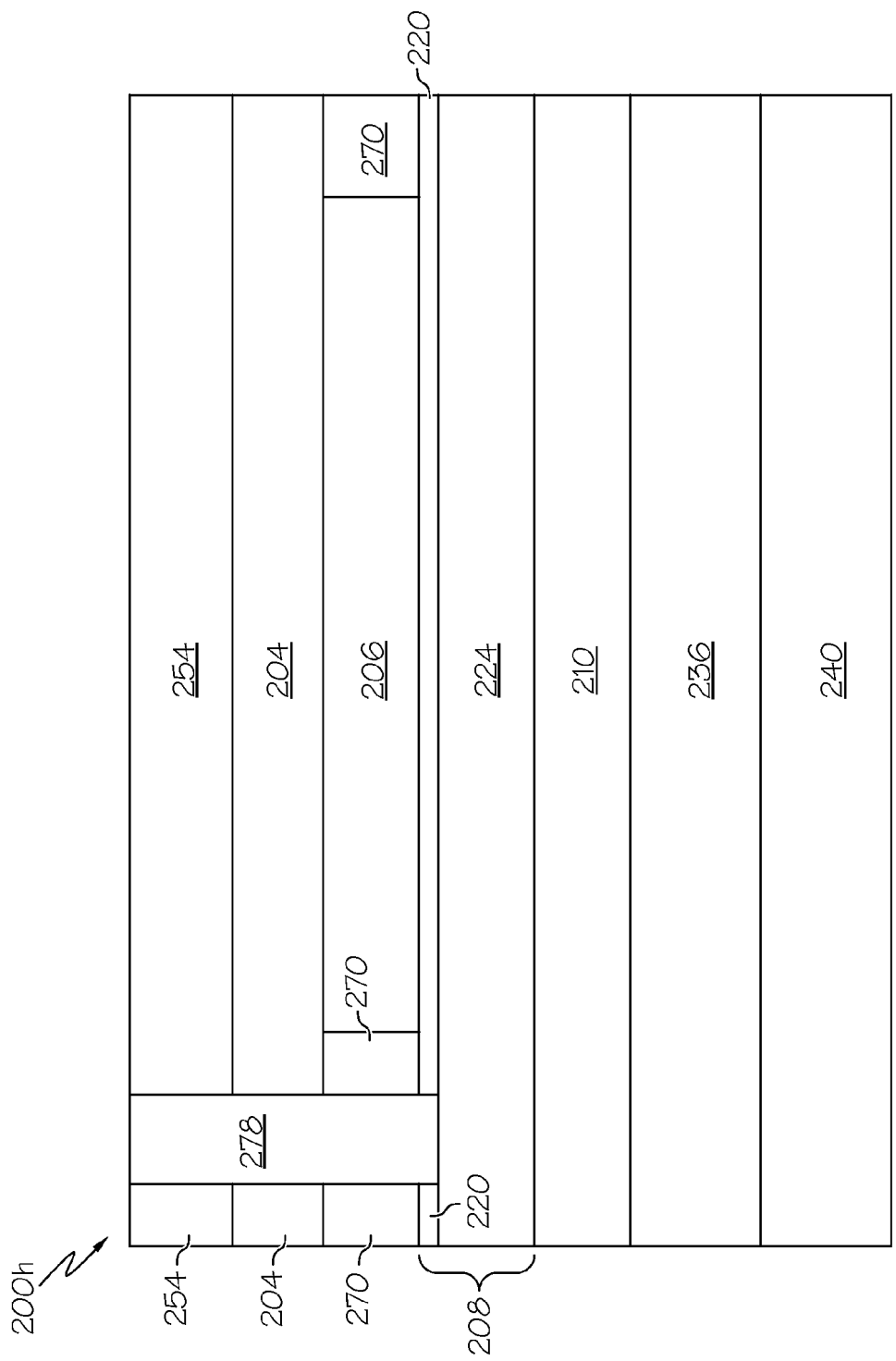

FIG. 16 depicts the semiconductor transistor device structure 200$i$ in the same state shown in FIG. 10, but from a different cross sectional perspective. Thus, FIG. 16 shows a conductive gate plug 278 that has been formed in the recess 272. The conductive gate plug 278, can be formed from the same material (and during the same process step) that is used for the conductive plugs 266 of the source/drain regions 216. Accordingly, the recess 272 is at least partially filled with the conductive material such that the conductive gate plug 278 contacts and is electrically coupled to the conductive gate element 224. For the embodiment depicted in FIG. 16, the conductive gate plug 278 is formed through the dielectric material 254, the insulating layer 204, the isolation region 270, and the gate insulator layer 220. More specifically, the upper portion of the conductive gate plug 278 resides in the dielectric material 254, a middle portion of the conductive gate plug 278 resides in the insulating layer 204, another middle portion of the conductive gate plug 278 resides in the isolation region 270, and the lowermost tip portion of the conductive gate plug 278 resides in the gate insulator layer 220.

Thereafter, any number of known process steps can be performed to complete the fabrication of the transistor device structure 200. Such additional steps may include, without limitation, the formation of additional dielectric layers and the formation of conductive metal traces/lines as needed to establish electrical contact with the conductive plugs. In contrast to conventional device structures, these conductive metal traces/lines will be formed for access from the back side of the host wafer. In other words, these conductive metal traces/lines will be formed overlying the uppermost surface of the dielectric material 254 (relative to the orientation shown in FIG. 10 and FIG. 16).

Figure 17:
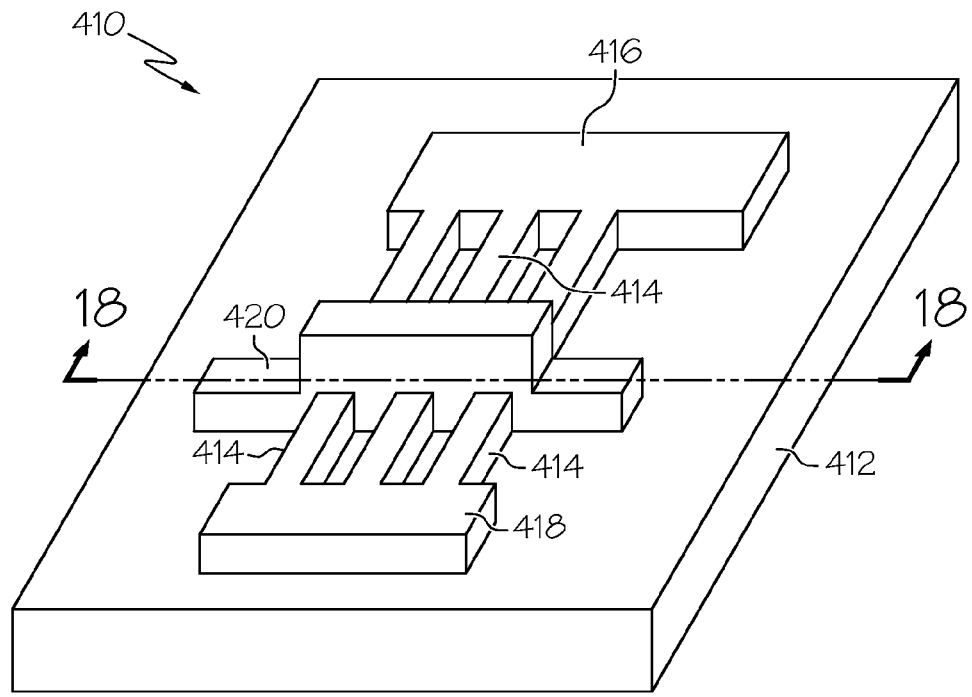
FIG. 17 is a perspective view of a finned semiconductor transistor device structure.
Figure 18:
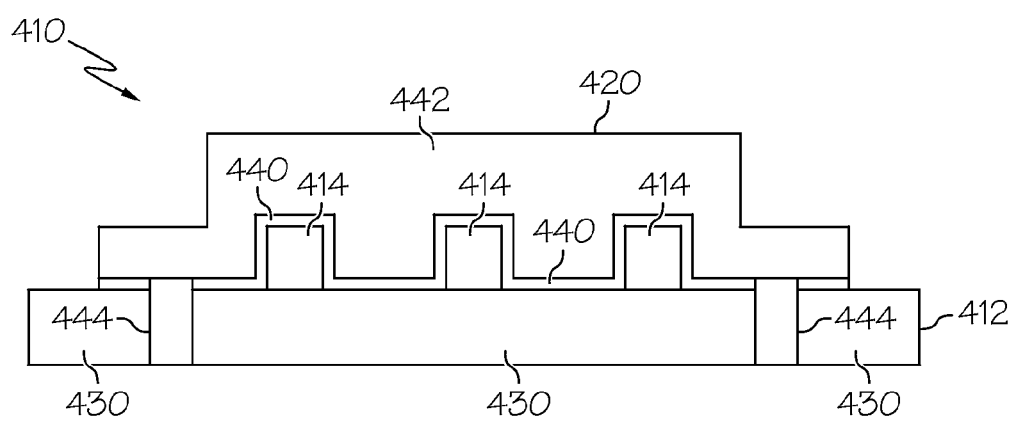
FIG. 18 is a cross sectional view of the finned semiconductor transistor device structure, as viewed from line 18-18 in FIG. 17.

The techniques and approaches for the fabrication of back side conductive plugs may also be utilized with semiconductor device structures that use semiconductor fins, e.g., FinFET devices or other multi-gate devices. Indeed, back side conductive plugs might be easier to fabricate for FinFET devices, due to the arrangement of the gate structures and fins relative to the underlying layer of insulating material. To better illustrate this concept, FIG. 17 is a perspective view of an exemplary FinFET device structure 410, and FIG. 18 is a cross sectional view of the FinFET device structure 410, as viewed from line 18-18 in FIG. 17. A FinFET is a type of transistor that can be fabricated using very small scale processes. FIG. 17 is a simplified perspective view of the FinFET device structure 410, which is formed on an SOI substrate 412. A FinFET is named for its use of one or more fins 414, which are formed from the semiconductor material of the SOI substrate 412. As shown in FIG. 17, each fin 414 extends between a source region 416 and a drain region 418 of the FinFET device structure 410. The FinFET device structure 410 also includes a gate structure 420 that is formed over and across the fins 414. The surface area of the fins 414 in contact with the gate structure 420 determines the effective channel of the FinFET device structure 410.

Referring to FIG. 18, the fins 414 are formed from the semiconductor material that overlies the layer of insulating material 430 of the SOI substrate 412. The gate structure 420 is then formed overlying the fins 414. Using conventional fabrication process steps, the gate structure 420 can be formed with a gate insulator layer 440 and a conductive gate element 442 overlying the gate insulator layer 440. Notably, the gate insulator layer 440 conforms to the shape and contour of the fins 414. Consequently, a portion of the gate insulator layer 440 resides over the layer of insulating material 430, and another portion of the gate insulator layer 440 resides over the fins 414. Likewise, the conductive gate element 442 (which may be formed from one or more layers of material) generally follows the shape and contour of the fins 414. Thus, some sections of the conductive gate element 442 reside within very close proximity of the insulating material 430, and other sections of the conductive gate element 442 are spaced apart from the layer of insulating material 430 (due to the intervening fins 414).

Due to the relatively thin nature of the gate insulator layer 440, for purposes of back side conductive plug formation the conductive gate element 442 and the fins 414 are effectively located at the same level, i.e., on the layer of insulating material 430. Accordingly, back side source/drain conductive plugs can be formed through the layer of insulating material 430 such that they reach the silicide contact elements that are formed at the boundary of the fins 414, at the boundary of the source region 416, and/or at the boundary of the drain region 418 of the FinFET device structure 410 (the back side source/drain conductive plugs and their corresponding silicide contact elements are not shown in FIG. 18, but they would be located at a different cross sectional plane). Likewise, back side gate conductive plugs 444 can be formed through the layer of insulating material 430 and through the thin gate insulator layer 440 such that they reach the conductive gate element 442. In contrast to the technique for fabricating the conductive gate plug 278 described above, the back side gate conductive plugs 444 for the FinFET device structure 410 need not pass through multiple dielectric, insulating, or isolation layers. Consequently, it is easier to control etching of the layer of insulating material 430 for the back side source/drain plugs and for the back side gate plugs 444. Indeed, the same etching chemistry and timing can be used to create the recesses needed for the back side source/drain plugs and the back side gate plugs 444.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor transistor device comprising:
   at least one lower layer of dielectric material;
   a layer of semiconductor material overlying the at least one lower layer of dielectric material;
   a gate structure formed overlying the layer of semiconductor material, the gate structure comprising a conductive gate element; and
   a conductive plug formed through the at least one lower layer of dielectric material, and electrically coupled to the conductive gate element;
   wherein the at least one lower layer of dielectric material comprises:
     a first layer of dielectric material; and
     a second layer of dielectric material, the second layer of dielectric material located between the layer of semiconductor material and the first layer of dielectric material.

2. The semiconductor transistor device of claim 1, wherein:
   the first layer of dielectric material comprises an oxide material;

the second layer of dielectric material comprises a buried oxide layer of a semiconductor-on-insulator substrate; and the layer of semiconductor material comprises a semiconductor layer of the semiconductor-on-insulator substrate.

3. A semiconductor transistor device comprising:

at least one lower layer of dielectric material;

a layer of semiconductor material overlying the at least one lower layer of dielectric material;

a gate structure formed overlying the layer of semiconductor material, the gate structure comprising a conductive gate element;

a conductive plug formed through the at least one lower layer of dielectric material, and electrically coupled to the conductive gate element; and an isolation region outboard of the layer of semiconductor material, wherein a portion of the conductive plug is formed in the isolation region.

4. The semiconductor transistor device of claim 1, wherein the conductive plug is formed from a metal material.

5. The semiconductor transistor device of claim 1, wherein:

the gate structure further comprises a gate insulator layer between the conductive gate element and the layer of semiconductor material; and a portion of the conductive plug is formed through the gate insulator layer.

6. The semiconductor transistor device of claim 1, further comprising:

at least one upper layer of dielectric material overlying the gate structure; and a support substrate overlying and coupled to the at least one upper layer of dielectric material.

7. A semiconductor transistor device comprising:

at least one lower layer of dielectric material;

a layer of semiconductor material overlying the at least one lower layer of dielectric material;

a gate structure formed overlying the layer of semiconductor material, the gate structure comprising a conductive gate element;

a conductive plug formed through the at least one lower layer of dielectric material, and electrically coupled to the conductive gate element;

at least one upper layer of dielectric material overlying the gate structure; and a heat sink overlying and coupled to the at least one upper layer of dielectric material.

8. A method of manufacturing a semiconductor device, the method comprising:

providing a semiconductor device structure having a layer of insulating material, an isolation region overlying the layer of insulating material, a gate insulator layer overlying the isolation region, and a conductive gate element overlying the gate insulator layer;

creating a recess through the layer of insulating material, the isolation region, and the gate insulator layer to expose a section of the conductive gate element;

depositing a dielectric material in the recess and overlying the layer of insulating material;

creating a via in the dielectric material, the via terminating at the conductive gate element; and filling the via with an electrically conductive material to form a conductive plug in the recess, the conductive plug being electrically coupled to the conductive gate element.

9. The method of claim 8, wherein filling the via comprises depositing a metal material in the via.

10. The method of claim 8, wherein:

creating the via results in a dielectric sleeve formed from the dielectric material; and at least a portion of the conductive plug resides in the dielectric sleeve.

11. A method of manufacturing a semiconductor device, the method comprising:

providing a semiconductor device structure having a layer of insulating material, an isolation region overlying the layer of insulating material, a gate insulator layer overlying the isolation region, and a conductive gate element overlying the gate insulator layer;

creating a recess through the layer of insulating material, the isolation region, and the gate insulator layer to expose a section of the conductive gate element, wherein creating the recess comprises selectively etching the layer of insulating material, the isolation region, and the gate insulator layer with an etchant, using an etch mask having features that define the recess; and forming a conductive plug in the recess, the conductive plug being electrically coupled to the conductive gate element.

\* \* \* \* \*